United States Patent
Huang et al.

(10) Patent No.: US 8,258,042 B2
(45) Date of Patent: Sep. 4, 2012

(54) BURIED LAYER OF AN INTEGRATED CIRCUIT

(75) Inventors: Yin-Fu Huang, Tainan (TW); Ming Rong Chang, Taipei (TW); Shih-Chin Lien, Sinjhuang (TW)

(73) Assignee: Macronix International Co., Ltd., Hsinchu (TW)

( * ) Notice: Subject to any disclaimer, the term of this patent is extended or adjusted under 35 U.S.C. 154(b) by 412 days.

(21) Appl. No.: 12/549,869

(22) Filed: Aug. 28, 2009

(65) Prior Publication Data

US 2011/0049677 A1    Mar. 3, 2011

(51) Int. Cl.
*H01L 21/76* (2006.01)

(52) U.S. Cl. ......... 438/418; 438/526; 438/530; 438/531

(58) Field of Classification Search .................. 438/418, 438/526, 530, 531
See application file for complete search history.

(56) References Cited

U.S. PATENT DOCUMENTS

| | | | |
|---|---|---|---|
| 5,476,800 A * | 12/1995 | Burton et al. | 438/506 |
| 5,587,325 A | 12/1996 | Comeau | |
| 6,218,270 B1 | 4/2001 | Yasunaga | |
| 6,531,363 B2 * | 3/2003 | Uchida | 438/275 |
| 7,419,893 B2 * | 9/2008 | Kijima | 438/527 |
| 7,507,647 B2 * | 3/2009 | Lim | 438/530 |
| 7,682,955 B1 * | 3/2010 | Tu et al. | 438/530 |
| 2006/0017079 A1 | 1/2006 | Chakravarthi et al. | |

FOREIGN PATENT DOCUMENTS

| | | |
|---|---|---|
| TW | 200610064 | 3/2006 |
| TW | I271875 | 1/2007 |
| WO | 2006023044 A2 | 3/2006 |

* cited by examiner

*Primary Examiner* — Phat X Cao

(74) *Attorney, Agent, or Firm* — Kenta Suzue; Haynes Beffel & Wolfeld LLP

(57) ABSTRACT

Various aspects of the technology are directed to integrated circuit manufacturing methods and integrated circuits. In one method, a first charge type buried layer in a semiconductor material of an integrated circuit by implanting first charge type dopants of the first charge type buried layer through a sacrificial oxide over the semiconductor material and through an intermediate region of the semiconductor material transited by the implanted first charge type dopants. When the implanted dopants pass through the sacrificial oxide, damage to the semiconductor crystalline lattice is averted. If the sacrificial oxide were absent, the implanted dopants would have passed through and damaged the semiconductor crystalline lattice instead. Later, a pre-anneal oxide is grown and removed.

20 Claims, 10 Drawing Sheets

BURIED LAYER OF AN INTEGRATED CIRCUIT

BACKGROUND

1. Field of the Invention

The described technology relates to forming a n-type or p-type buried layer with few defects in an integrated circuit.

2. Description of Related Art

Implantation of dopants is a more accurate alternative to diffusion. Unfortunately, as the energetic dopants penetrate the substrate material damage to the crystalline structure results. Collisions with the nuclei of the substrate material knock the substrate nuclei out of the crystalline lattice, resulting in crystalline defects. Accordingly, the use of implantation technology is a tradeoff of more precise doping in exchange for damage to the semiconductor crystal structure.

SUMMARY

The described technology reduces the downside of implantation by disposing of an amount of the crystal lattice which was damaged during implantation.

One aspect of the technology is an integrated circuit manufacturing method, comprising:

making a first charge type buried layer in a semiconductor material of an integrated circuit by implanting first charge type dopants of the first charge type buried layer through a sacrificial oxide over the semiconductor material and through an intermediate region of the semiconductor material transited by the implanted first charge type dopants. When the implanted dopants pass through the sacrificial oxide, damage to the semiconductor crystalline lattice is averted. If the sacrificial oxide were absent, the implanted dopants would have passed through and damaged the semiconductor crystalline lattice instead.

removing the sacrificial oxide transited by the implanted first charge type dopants. The sacrificial oxide has served its purpose of absorbing damage from transiting implanted dopants. The damage would otherwise have occurred in the semiconductor crystalline lattice.

after removing the sacrificial oxide, growing a pre-anneal oxide consuming part of the intermediate region of the semiconductor material transited by the implanted first charge type dopants. When pre-anneal oxide is grown, such as silicon oxide on silicon, part of the silicon substrate is consumed in the chemical reaction. As with the prior sacrificial oxide, this consumed semiconductor material had also been transited by, and damaged by, the implanted dopants. Accordingly, growing the pre-anneal oxide helps to remove semiconductor material with a damaged crystalline lattice.

annealing the first charge type buried layer covered by the pre-anneal oxide. Annealing activates the implanted dopants by helping to move the implanted dopants into appropriate locations of the crystalline lattice.

removing the pre-anneal oxide that consumed part of the intermediate region of the semiconductor material transited by the implanted first charge type dopants. Similar to the sacrificial oxide, removal of the pre-anneal oxide serves the purpose of removing material which occupied space that had been transited by implanted dopants.

Accordingly, the technology described above disposes of an amount of the crystal lattice which was damaged during implantation. Various specific embodiments are discussed below.

In many embodiments, the first charge type buried layer is an n-type buried layer, and the first charge type dopants are n-type dopants.

In many embodiments, the first charge type buried layer is a p-type buried layer, and the first charge type dopants are p-type dopants. In the various specific embodiments discussed herein, in alternative embodiments the n-type buried layer may be changed to a p-type buried layer and the n-type dopants may be changed to p-type dopants.

One embodiment adds the following steps:

after removing the pre-anneal oxide, forming semiconductor material in the integrated circuit over the n-type buried layer.

forming source and drain regions of a field effect device in the semiconductor material in the integrated circuit over the n-type buried layer, the source and drain regions having a channel region between the source and drain regions, such that after manufacturing the integrated circuit, the n-type buried layer has a peak dopant concentration at a vertical depth below the channel region in the integrated circuit and above a p-type substrate of the integrated circuit.

In one embodiment, a thickness of the pre-anneal oxide is limited to no more than about 300 angstroms. According to experimental data, a thickness exceeding 400 angstroms will induce defects.

In one embodiment, the sacrificial oxide is made with a thickness of between about 50 and 300 angstroms. Below 50 angstroms, it is believed that the sacrificial oxide is too thin to provide a substantial protective effect against implantation damage. Above 300 angstroms, it is believed that the energies required to implant the ions to sufficient depth become impractically high.

In one embodiment, annealing the n-type buried layer is performed for at least about 6 hours at least at about 1200 C. The annealing time and temperature affects sheet resistance of the n-type buried layer, but does not change defect amounts. An annealing time of 4 hours has n-type buried layer resistance Rs of 40-44 ohm/sq based on experimental data. Annealing temperature as low as 1100 C is not expected to change the defect amount, though n-type buried layer resistance Rs is expected to be be higher.

The described technology provides performance benefits which are realized in various applications, as follows.

One embodiment, adds the following steps:

after removing the pre-anneal oxide, forming semiconductor material in the integrated circuit over the n-type buried layer.

forming at least a p-type well in the semiconductor material in the integrated circuit over the n-type buried layer. A junction between the p-type well and the n-type buried layer has a breakdown voltage magnitude of at least about 60 volts. This high voltage junction is a benefit of the described technology.

forming source and drain regions of a field effect device, at least one of the source and drain regions formed in the p-type well.

One embodiment, adds the following steps:

after removing the pre-anneal oxide, forming semiconductor material in the integrated circuit over the n-type buried layer; and forming at least a p-type well in the semiconductor material in the integrated circuit over the n-type buried layer, wherein the n-type buried layer electrically isolates the p-type well from a p-type substrate of the integrated circuit; and forming source and drain regions of a field effect device, at least one of the source and drain regions formed in the p-type well.

One embodiment, adds the following steps:

after removing the pre-anneal oxide, forming semiconductor material in the integrated circuit over the n-type buried layer; and forming at least a p-type well in the semiconductor material in the integrated circuit over the n-type buried layer, wherein the n-type buried layer electrically isolates the p-type well from a p-type substrate of the integrated circuit; and forming source and drain regions of a field effect device, the source and drain regions formed in the p-type well.

One embodiment, adds the following steps:

after removing the pre-anneal oxide, forming semiconductor material in the integrated circuit over the n-type buried layer; and forming p-type and n-type wells in the semiconductor material in the integrated circuit over the n-type buried layer, wherein the n-type buried layer electrically isolates the p-type well from a p-type substrate of the integrated circuit; and forming source and drain regions of a field effect device in the p-type and n-type wells.

One embodiment, adds the following steps:

after removing the pre-anneal oxide, forming semiconductor material in the integrated circuit over the n-type buried layer; and forming p-type wells in the semiconductor material in the integrated circuit over the n-type buried layer, wherein the n-type buried layer electrically isolates the p-type wells from a p-type substrate of the integrated circuit; and forming source and drain regions of a field effect device in the p-type wells.

One embodiment, adds the following steps:

after removing the pre-anneal oxide, forming semiconductor material in the integrated circuit over the n-type buried layer; and forming at least an n-type well in the semiconductor material in the integrated circuit over the n-type buried layer; and forming source and drain regions of a field effect device, at least one of the source and drain regions formed in the n-type well, wherein the n-type buried layer lowers a resistance of said at least one of the source and drain regions formed in the n-type well.

In one embodiment, the n-type buried layer is part of a super-steep retrograde well.

In one embodiment, the n-type dopants are antimony.

In one embodiment, the dopants are implanted with an energy of at least 100 keV. In one embodiment, the dopants are implanted with a dose of less than $5 \times 10^{15}$ cm$^{-2}$ In one embodiment, the n-type buried layer corresponds to a maximum defect density of 5 defects per area of a 6 inch wafer. In one embodiment, the n-type buried layer has a sheet resistance of less than 40 ohms per square.

One embodiment, adds the following steps:

after removing the pre-anneal oxide, forming semiconductor material in the integrated circuit over the n-type buried layer; and forming a bipolar junction device in the semiconductor material in the integrated circuit, such that the n-type buried layer is a buried collector of the bipolar junction transistor above a p-type substrate of the integrated circuit.

One embodiment, adds the following steps:

after removing the pre-anneal oxide, forming epitaxial semiconductor material in the integrated circuit over the n-type buried layer.

Another aspect of the technology is an integrated circuit, comprising the following:

a second charge type substrate;

a first charge type buried layer over the second charge type substrate;

an epitaxial layer above the first charge type buried layer, including at least a:

a second charge type, wherein a junction between the second charge type well and the first charge type buried layer has a breakdown voltage magnitude of at least 60 volts.

In many embodiments, the first charge type buried layer is an n-type buried layer, the second charge type substrate is a p-type substrate, the second charge type well is a p-type well In many embodiments, the first charge type buried layer is a p-type buried layer, the second charge type substrate is an n-type substrate, the second charge type well is an n-type well. In the various specific embodiments discussed herein, in alternative embodiments the n-type buried layer may be changed to a p-type buried layer, the p-type substrate may be changed to an n-type substrate, and the p-type well may be changed to an n-type well.

One embodiment, includes source and drain regions of a field effect transistor, at least one of the source and drain regions in the p-type well. Another embodiment further includes collector, base and emitter regions of a bipolar junction transistor, wherein the n-type buried layer is adjacent to the collector region.

Another aspect of the technology is an integrated circuit manufacturing method, comprising the following steps:

providing a second charge type substrate;

making a first charge type buried layer over the second charge type substrate;

making an epitaxial layer above the first charge type buried layer;

making a second charge type well in the epitaxial layer, wherein a junction between the second charge type well and the first charge type buried layer has a breakdown voltage magnitude of at least 60 volts.

BRIEF DESCRIPTION OF THE DRAWINGS

FIG. 1 shows a p-type substrate on which the n-type buried layer is grown.

FIG. 2 shows the formation of a sacrificial oxide on the p-type substrate.

FIG. 3 shows the implantation of an n-type buried layer through the sacrificial oxide on the p-type substrate.

FIG. 4 shows the removal of the sacrificial oxide.

FIG. 5 shows the formation of a pre-anneal oxide over the n-type buried layer.

FIG. 6 shows the annealing of the n-type buried layer covered by the pre-anneal oxide.

FIG. 7 shows the removal of the pre-anneal oxide.

FIG. 8 shows the formation of epitaxial semiconductor material over the n-type buried layer.

FIG. 9 shows a high voltage PMOS FET with an n-type buried layer.

FIG. 10 shows a high voltage NMOS FET with an n-type buried layer.

FIG. 11 shows an NMOS FET with an n-type buried layer.

FIG. 12 shows a BJT with an n-type buried layer.

FIG. 13 shows an n-type well in which the n-type buried layer is grown.

FIG. 14 shows the formation of a sacrificial oxide on the n-type well.

FIG. 15 shows the implantation of an n-type buried layer through the sacrificial oxide in the n-type well.

FIG. 16 shows the removal of the sacrificial oxide.

FIG. 17 shows the formation of a pre-anneal oxide over the n-type buried layer.

FIG. 18 shows the annealing of the n-type buried layer covered by the pre-anneal oxide.

FIG. 19 shows the removal of the pre-anneal oxide.

DETAILED DESCRIPTION

An n-type buried layer in a p-type substrate generally isolates the p-type substrate from the p-type well. An n-type buried layer in a p-type substrate also reduces resistance of an n-well in a p-type substrate.

A p-type buried layer in an n-type substrate generally isolates the n-type substrate from the n-type well. A p-type buried layer in an n-type substrate also reduces resistance of a p-well in an n-type substrate.

FIGS. 1-8 show a process flow of making an n-type buried layer on a p-type substrate.

Figure 1:
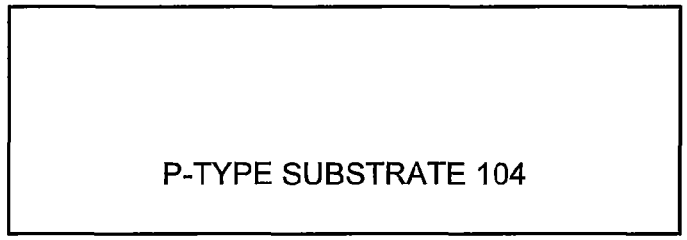
FIGS. 1-8 show a process flow of making an n-type buried layer on a p-type substrate.

FIG. 1 shows a p-type substrate 104 on which the n-type buried layer is grown. A p-type epitaxial layer over a substrate is also considered a type of p-type substrate.

Figure 2:
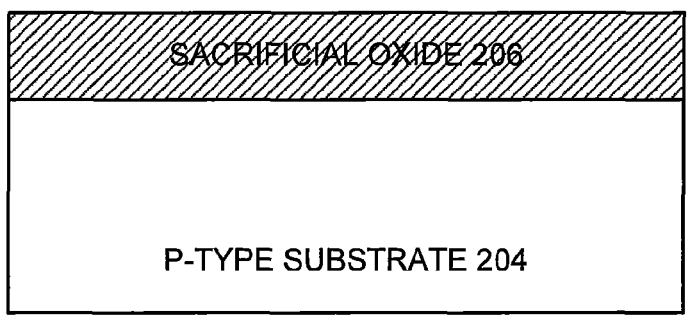

FIG. 2 shows the formation of a sacrificial oxide 206 on the p-type substrate 204.

The sacrificial oxide is made with a thickness of between about 50 and 300 angstroms. Below 50 angstroms, it is believed that the sacrificial oxide is too thin to provide a substantial protective effect against implantation damage. Above 300 angstroms, it is believed that the energies required to implant the ions to sufficient depth become impractically high. These thicknesses are based on extrapolation from experimental data gathered from a sacrificial oxide having a thickness of 200 angstroms. The thickness is a compromise, because a thicker sacrificial oxide will absorb more damage caused by the implantation, but require larger implantation energies. Larger implantation energies in turn tend to cause damage to the semiconductor lattice.

Figure 3:
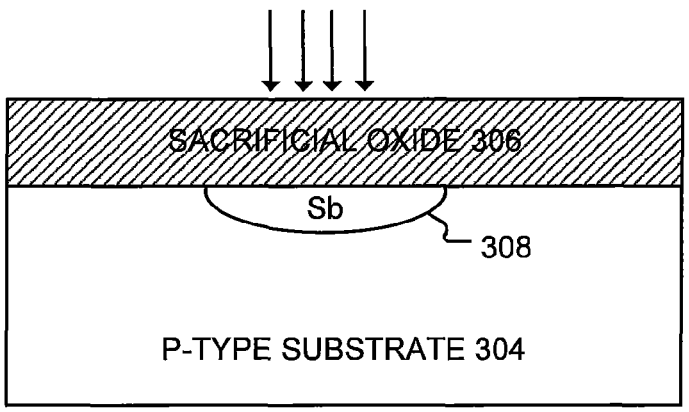

FIG. 3 shows the implantation of an n-type buried layer 308 through the sacrificial oxide 306 on the p-type substrate 304.

The implanted dopant is preferably Sb. Alternatively, As or P can be implanted. However, lower atomic number/weight dopants tend to diffuse and spread too much in subsequent steps with heat.

A sample implant dose is less than $5\times10^{15}$ cm$^{-2}$. Larger doses tend to cause excessive damage, even with the described technology. A sample implantation energy is 100 keV, which is a deep implant energy. A sample deep implant depth is 380 angstroms, versus a shallow implant depth such as at 150 angstroms. The described technology has the unexpected result of being effective despite the relatively deep implant depths, and the relatively large volume of damaged semiconductor lattice left in the wake of the implanted dopants.

Figure 4:
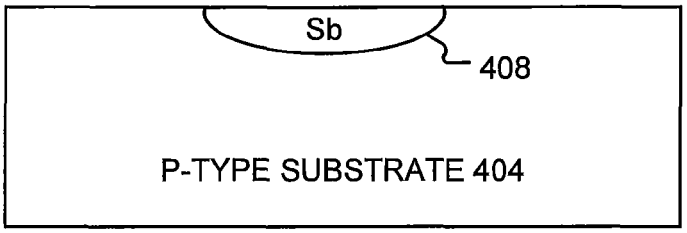

FIG. 4 shows the removal of the sacrificial oxide.

Various etch techniques can be applied, such as a wet etch.

Figure 5:
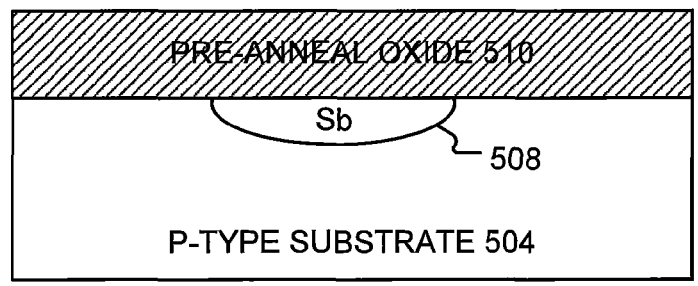

FIG. 5 shows the formation of a pre-anneal oxide 510 over the n-type buried layer 508. A typical pre-anneal oxide temperature is 920 C for easier control of the oxide thickness. Other embodiments have a pre-anneal oxide temperature in the range of 920 C ±100 C.

When pre-anneal oxide—also called pre-oxidation oxide—is grown, such as silicon oxide on silicon, part of the silicon substrate is consumed in the chemical reaction. As with the prior sacrificial oxide, this consumed semiconductor material had also been transited by, and damaged by, the implanted dopants. Accordingly, growing the pre-anneal oxide helps to remove semiconductor material with a damaged crystalline lattice.

Figure 6:
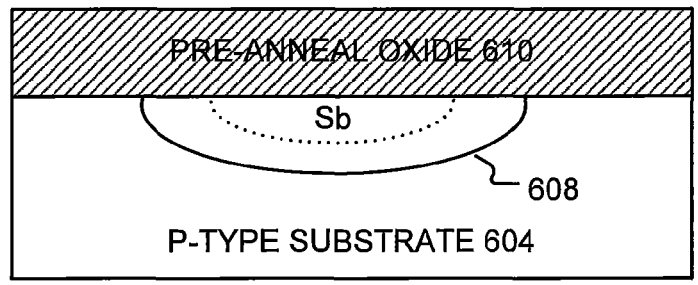

FIG. 6 shows the annealing of the n-type buried layer covered by the pre-anneal oxide 610, showing the resulting expansion of the n-type buried layer 608.

Annealing the n-type buried layer is performed for at least about 6 hours at least at about 1200 C. These annealing conditions result in a sheet resistance of less than 40 ohms per square.

Figure 7:
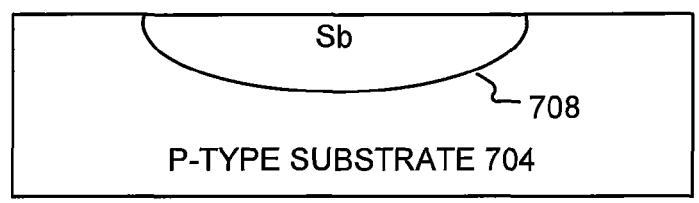

FIG. 7 shows the removal of the pre-anneal oxide.

Various etch techniques can be applied, such as a wet etch.

Figure 8:
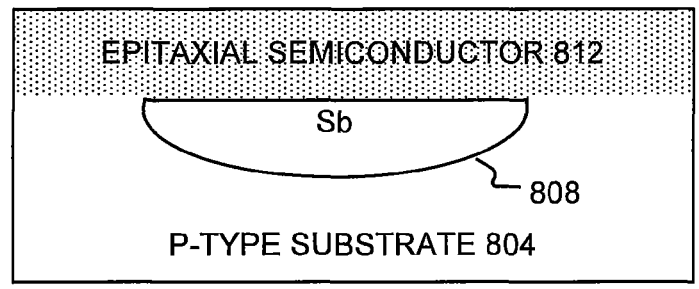

FIG. 8 shows the formation of epitaxial semiconductor material 812 over the n-type buried layer 808.

FIGS. 9-12 show example end devices with an n-type buried layer.

Figure 9:
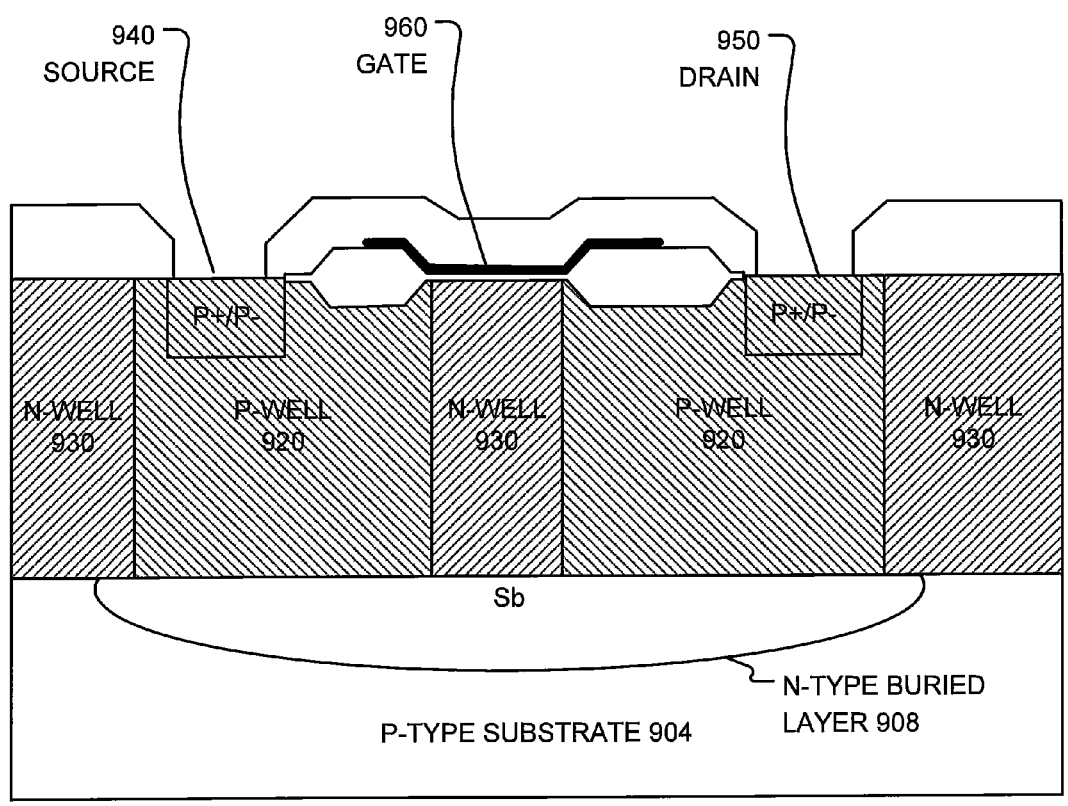
FIGS. 9-12 show example end devices with an n-type buried layer.

FIG. 9 shows a high voltage PMOS FET with an n-type buried layer.

The FET is formed over the n-type buried layer 908 over the p-type substrate 904. The p+/p− source 940 and p+/p− drain 950 are formed in respective p-wells 920. These p-wells 920 are separated by an n-well 930. The gate 960 is formed over this n-well 930.

The n-type buried layer 908 electrically isolates the p-wells 920 from the p-type substrate 904. The n-type buried layer 908 also electrically isolates the p+/p− source 940 and p+/p− drain 950 from the p-type substrate 904.

Figure 10:
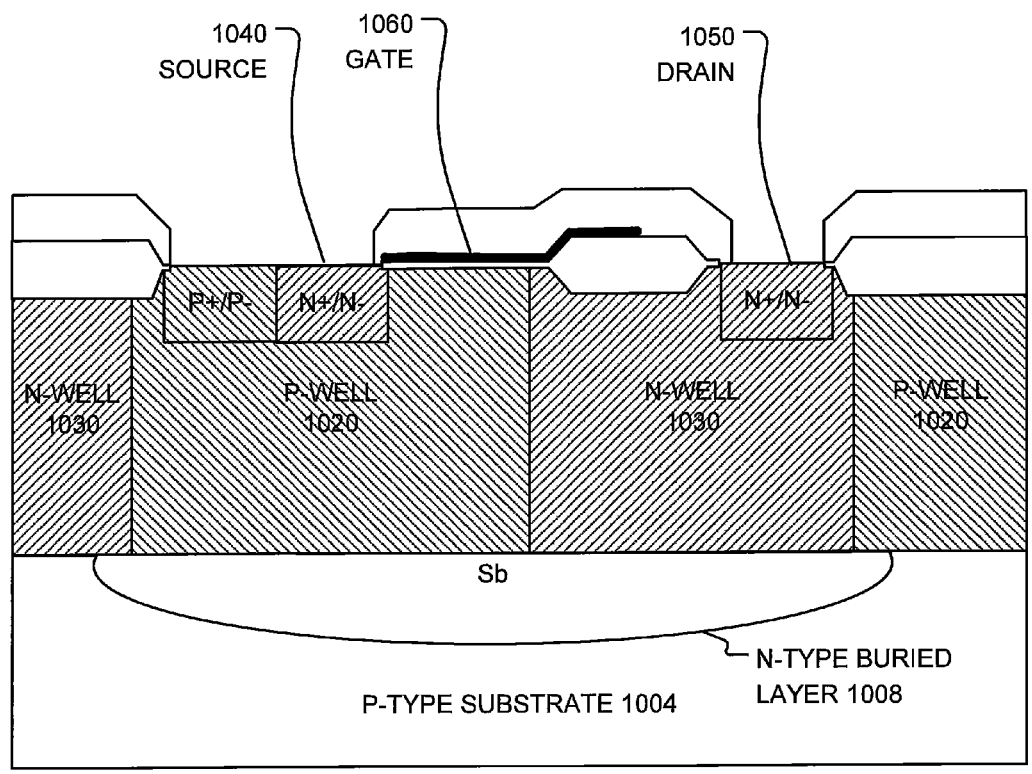

FIG. 10 shows a high voltage NMOS FET with an n-type buried layer.

The FET is formed over the n-type buried layer 1008 over the p-type substrate 1004. The n+/n− source 1040, adjacent to a p+/p− area, is formed in a p-well 1020. The n+/n− drain 1050 is formed in an n-well 1020. The gate 1060 is formed over part of the p-well 1020, which physically separates the source 1040 from the n-well 1020 of the drain 1050.

The n-type buried layer 1008 electrically isolates the p-well 1020 from the p-type substrate 1004, with corresponding improvement in body effect control and bulk side potential control. The n-type buried layer 1008 under the n-well 1030 also improves the drain side resistance, with an estimated improve specific on resistance Ronsp of 10%.

Figure 11:
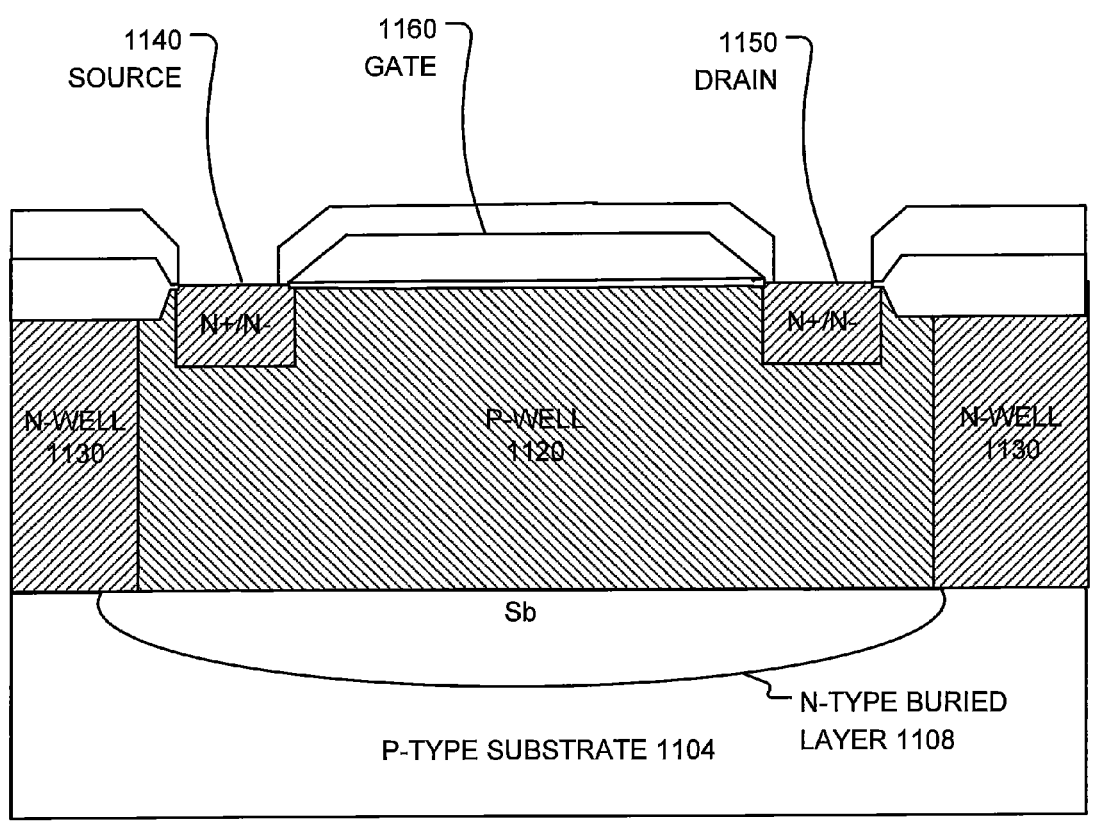

FIG. 11 shows an NMOS FET with an n-type buried layer.

The FET is formed over the n-type buried layer 1108 over the p-type substrate 1104. The n+/n− source 1140 and n+/n− drain 1150 are formed in a p-well 1120. The gate 1160 is formed over part of the p-well 1120, which physically separates the source 1140 from the drain 1150.

The n-type buried layer 1108 electrically isolates the p-well 1120 from the p-type substrate 1104, with corresponding improvement in body effect control and bulk side potential control.

Figure 12:
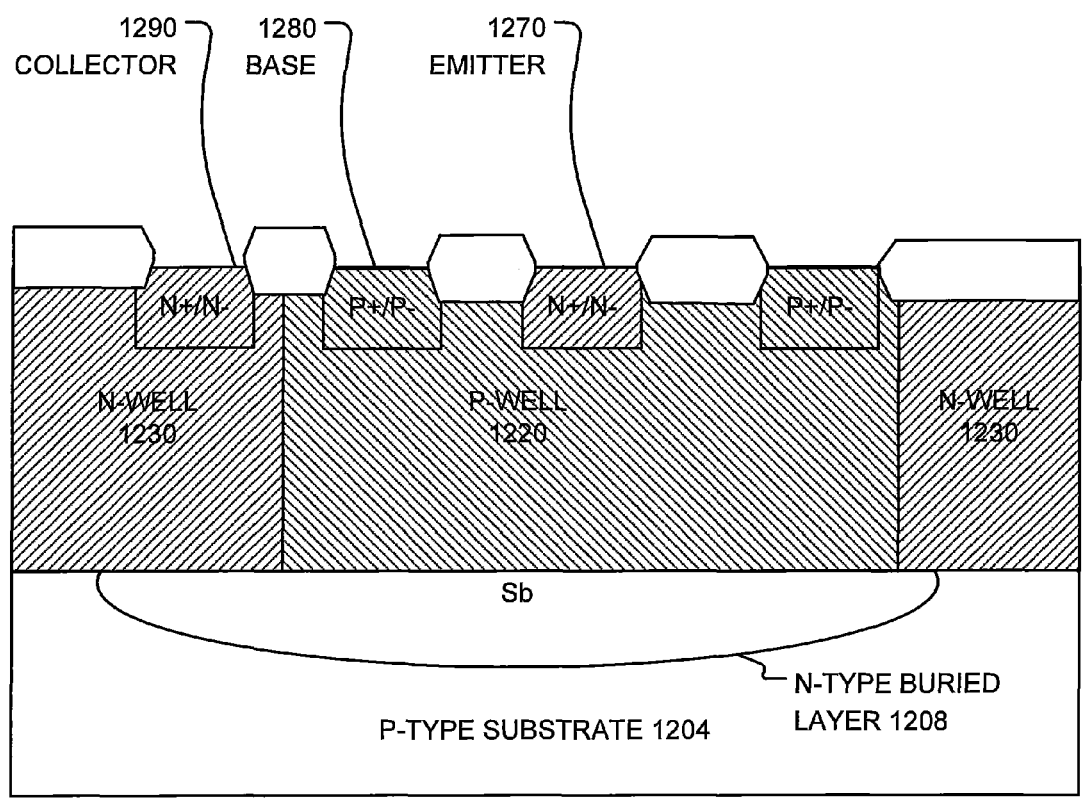

FIG. 12 shows a BJT with an n-type buried layer.

The BJT is formed over the n-type buried layer 1208 over the p-type substrate 1204. The n+/n− emitter 1270 is formed in a p-well 1220. The collector 1290 is an n+/n− region in an n-well 1230. The base 180 is a p+/p− contact in the p-well 1220, such that the p+/p− contact is in physically in between the n+/n− emitter 1270 and the n+/n− contact of the collector 1290.

The n-type buried layer 1208 electrically isolates the p-well 1220 from the p-type substrate 1204. The n-type buried layer 1208 is physically and electrically connected to the n-well 1230 of the collector 1290, and thereby decreases the collector resistance.

FIGS. 13-19 show a process flow of making an n-type buried layer in an n-type well. This technology is useful for forming a SSR, super-steep retrograde, doping profile. The SSR profile helps to prevent the source and drain depletion regions from merging, and is placed sufficiently below the channel to avoid harming the carrier mobility of the channel.

Figure 13:
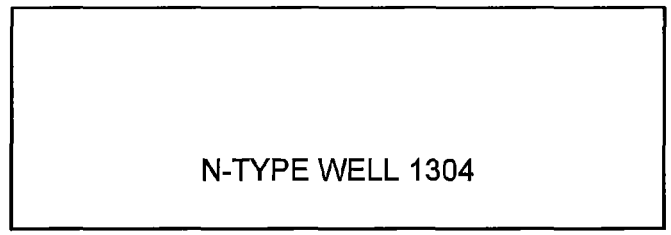
FIGS. 13-19 show a process flow of making an n-type buried layer in an n-type well.

FIG. 13 shows an n-type well 1304 in which the n-type buried layer is grown.

Figure 14:
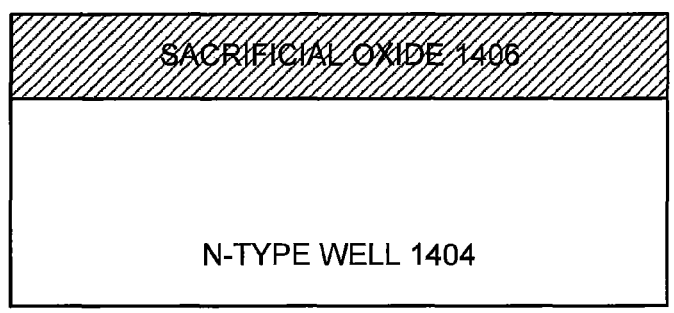

FIG. 14 shows the formation of a sacrificial oxide 1406 on the n-type well 1404.

Figure 15:
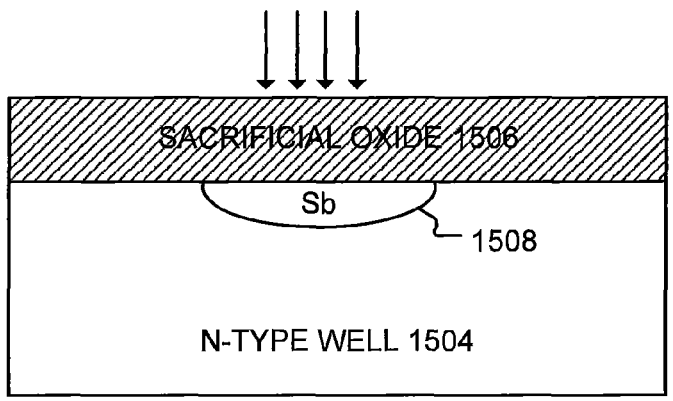

FIG. 15 shows the implantation of an n-type buried layer 1508 through the sacrificial oxide 1506 in the n-type well 1504.

Figure 16:
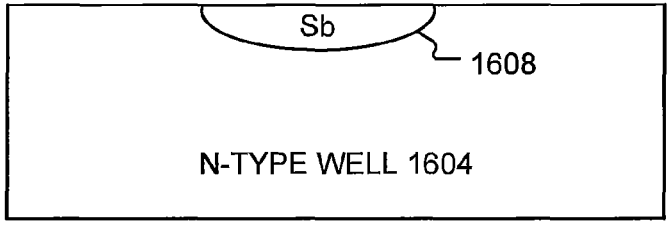

FIG. 16 shows the removal of the sacrificial oxide.

Figure 17:
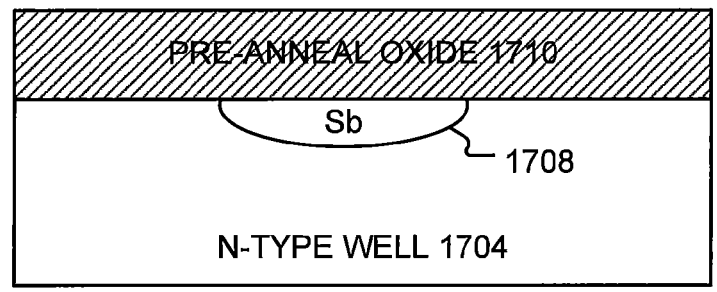

FIG. 17 shows the formation of a pre-anneal oxide 1710 over the n-type buried layer 1708.

Figure 18:
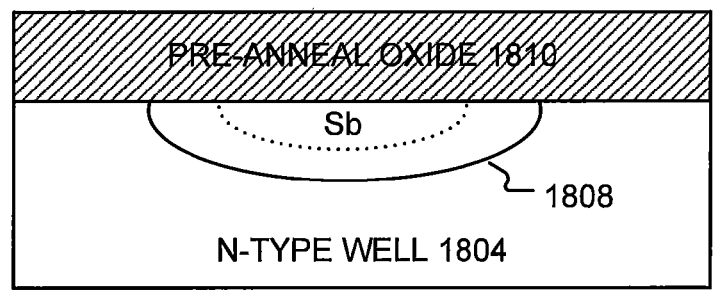

FIG. 18 shows the annealing of the n-type buried layer covered by the pre-anneal oxide 1810, showing the resulting expansion of the n-type buried layer 1808.

Figure 19:
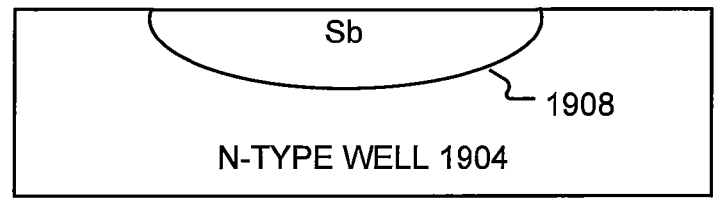

FIG. 19 shows the removal of the pre-anneal oxide.

Figure 20:
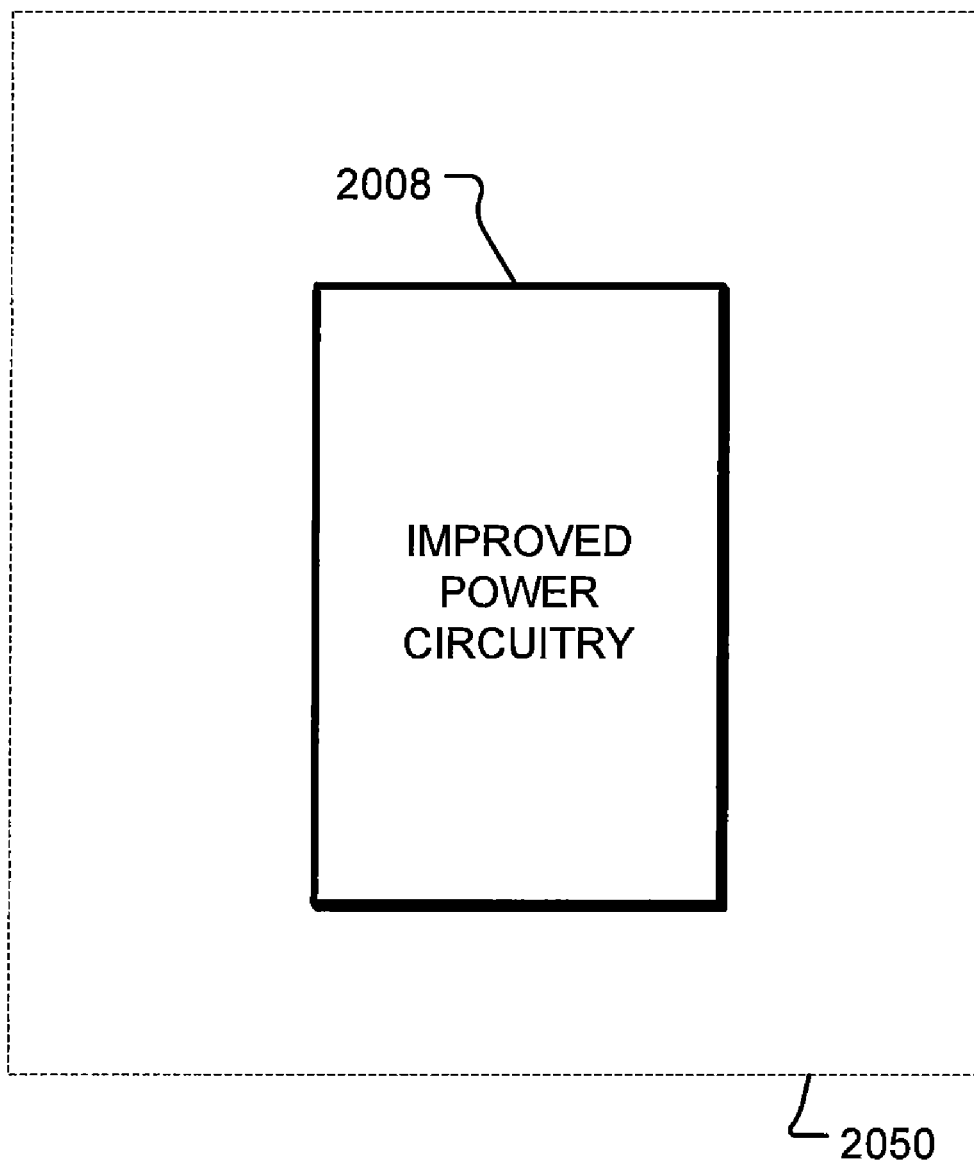
FIG. 20 shows an integrated circuit with circuitry improved by the n-type buried layer as described herein.

FIG. 20 shows an integrated circuit 2050 with circuitry improved by the n-type buried layer 2008 as described herein.

Figure 21:
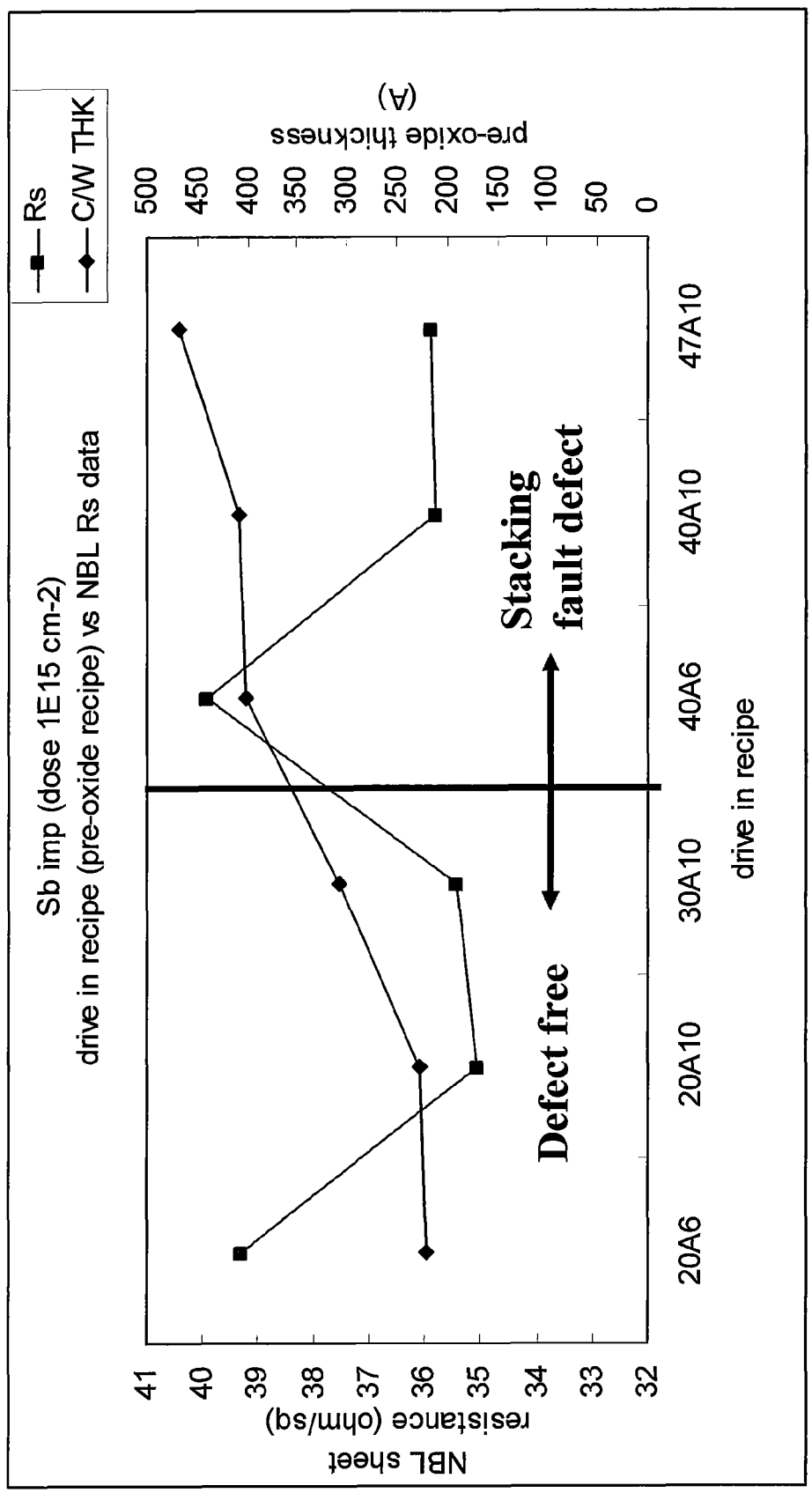
FIG. 21 shows experimental data of the n-type buried layer as described herein.

FIG. 21 shows experimental data of the n-type buried layer as described herein. Shown is the n-type buried layer drive-in recipe versus n-type buried layer sheet resistance Rs, all with an Sb implantation dose of $10^{15}$ cm$^{-2}$.

Drive-in recipe 20A6 corresponds to a pre-anneal oxide thickness of 200 angstroms and an anneal time of 6 hours. Drive-in recipe 20A10 corresponds to a pre-anneal oxide thickness of 200 angstroms and an anneal time of 10 hours. Drive-in recipe 30A10 corresponds to a pre-anneal oxide thickness of 300 angstroms and an anneal time of 10 hours. Drive-in recipe 40A6 corresponds to a pre-anneal oxide thickness of 400 angstroms and an anneal time of 6 hours. Drive-in recipe 40A10 corresponds to a pre-anneal oxide thickness of 400 angstroms and an anneal time of 10 hours. Drive-in recipe 47A10 corresponds to a pre-anneal oxide thickness of 470 angstroms and an anneal time of 10 hours.

In the graph legend, CJW THK indicates thickness of control wafers without any implantation.

To determine whether the samples were defect free or had stacking fault defects, two methods were used, review with an optical microscope with Nomarski function, and checking with a surface inspection machine.

FIG. 21 shows that a pre-anneal oxidation thickness <=300 angstroms produces defect a free n-type buried layer. An n-type buried layer drive-in time >=6 hours makes resistance Rs<40 ohm/sq of the n-type buried layer. A Sb implant dosage of $10^{15}$ cm$^{-2}$ and suitable drive-in recipe produces a defect free n-type buried layer resistance Rs<40 ohm/sq.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit manufacturing method, comprising:
    making a first charge type buried layer in a semiconductor material of an integrated circuit by implanting first charge type dopants of the first charge type buried layer through a sacrificial oxide over the semiconductor material and through an intermediate region of the semiconductor material transited by the implanted first charge type dopants;
    removing the sacrificial oxide transited by the implanted first charge type dopants;
    after removing the sacrificial oxide, growing a pre-anneal oxide consuming part of the intermediate region of the semiconductor material transited by the implanted first charge type dopants;
    annealing the first charge type buried layer covered by the pre-anneal oxide; and
    removing the pre-anneal oxide that consumed part of the intermediate region of the semiconductor material transited by the implanted first charge type dopants.

2. The method of claim 1, wherein the first charge type buried layer is an n-type buried layer, the first charge type dopants are n-type dopants, the method further comprising:
    after removing the pre-anneal oxide, forming semiconductor material in the integrated circuit over the n-type buried layer; and
    forming source and drain regions of a field effect device in the semiconductor material in the integrated circuit over the n-type buried layer, the source and drain regions having a channel region between the source and drain regions, such that after manufacturing the integrated circuit, the n-type buried layer has a peak dopant concentration at a vertical depth below the channel region in the integrated circuit and above a p-type substrate of the integrated circuit.

3. The method of claim 1, wherein the first charge type buried layer is an n-type buried layer, the first charge type dopants are n-type dopants, and wherein said growing the pre-anneal oxide limits a thickness of pre-anneal oxide to no more than about 300 angstroms.

4. The method of claim 1, wherein the first charge type buried layer is an n-type buried layer, the first charge type dopants are n-type dopants, the method further comprising:
    before making the n-type buried layer, making the sacrificial oxide with a thickness of between about 50 and 300 angstroms.

5. The method of claim 1, wherein the first charge type buried layer is an n-type buried layer, the first charge type dopants are n-type dopants, and wherein said annealing the n-type buried layer is performed for at least about 6 hours at least at about 1200 C.

6. The method of claim 1, wherein the first charge type buried layer is an n-type buried layer, the first charge type dopants are n-type dopants, the method further comprising:
    after removing the pre-anneal oxide, forming semiconductor material in the integrated circuit over the n-type buried layer; and
    forming at least a p-type well in the semiconductor material in the integrated circuit over the n-type buried layer, wherein a junction between the p-type well and the n-type buried layer has a breakdown voltage magnitude of at least about 60 volts; and
    forming source and drain regions of a field effect device, at least one of the source and drain regions formed in the p-type well.

7. The method of claim 1, wherein the first charge type buried layer is an n-type buried layer, the first charge type dopants are n-type dopants, the method further comprising:
- after removing the pre-anneal oxide, forming semiconductor material in the integrated circuit over the n-type buried layer; and
- forming at least a p-type well in the semiconductor material in the integrated circuit over the n-type buried layer, wherein the n-type buried layer electrically isolates the p-type well from a p-type substrate of the integrated circuit; and
- forming source and drain regions of a field effect device, at least one of the source and drain regions formed in the p-type well.

8. The method of claim 1, wherein the first charge type buried layer is an n-type buried layer, the first charge type dopants are n-type dopants, the method further comprising:
- after removing the pre-anneal oxide, forming semiconductor material in the integrated circuit over the n-type buried layer; and
- forming at least a p-type well in the semiconductor material in the integrated circuit over the n-type buried layer, wherein the n-type buried layer electrically isolates the p-type well from a p-type substrate of the integrated circuit; and
- forming source and drain regions of a field effect device, the source and drain regions formed in the p-type well.

9. The method of claim 1, wherein the first charge type buried layer is an n-type buried layer, the first charge type dopants are n-type dopants, the method further comprising:
- after removing the pre-anneal oxide, forming semiconductor material in the integrated circuit over the n-type buried layer; and
- forming p-type and n-type wells in the semiconductor material in the integrated circuit over the n-type buried layer, wherein the n-type buried layer electrically isolates the p-type well from a p-type substrate of the integrated circuit; and
- forming source and drain regions of a field effect device in the p-type and n-type wells.

10. The method of claim 1, wherein the first charge type buried layer is an n-type buried layer, the first charge type dopants are n-type dopants, the method further comprising:
- after removing the pre-anneal oxide, forming semiconductor material in the integrated circuit over the n-type buried layer; and
- forming p-type wells in the semiconductor material in the integrated circuit over the n-type buried layer, wherein the n-type buried layer electrically isolates the p-type wells from a p-type substrate of the integrated circuit; and
- forming source and drain regions of a field effect device in the p-type wells.

11. The method of claim 1, wherein the first charge type buried layer is an n-type buried layer, the first charge type dopants are n-type dopants, the method further comprising:
- after removing the pre-anneal oxide, forming semiconductor material in the integrated circuit over the n-type buried layer; and
- forming at least an n-type well in the semiconductor material in the integrated circuit over the n-type buried layer; and
- forming source and drain regions of a field effect device, at least one of the source and drain regions formed in the n-type well,
- wherein the n-type buried layer lowers a resistance of said at least one of the source and drain regions formed in the n-type well.

12. The method of claim 1, wherein the first charge type buried layer is an n-type buried layer, the first charge type dopants are n-type dopants, and wherein the n-type buried layer is part of a super-steep retrograde well.

13. The method of claim 1, wherein the first charge type buried layer is an n-type buried layer, the first charge type dopants are n-type dopants, and wherein said n-type dopants are antimony.

14. The method of claim 1, wherein the first charge type buried layer is an n-type buried layer, the first charge type dopants are n-type dopants, and wherein said implanting of the n-type buried layer, implants dopants with an energy of at least 100 keV.

15. The method of claim 1, wherein the first charge type buried layer is an n-type buried layer, the first charge type dopants are n-type dopants, and wherein said implanting of the n-type buried layer, implants dopants with a dose of less than $5 \times 10^{15}$ cm$^{-2}$.

16. The method of claim 1, wherein the first charge type buried layer is an n-type buried layer, the first charge type dopants are n-type dopants, and wherein said n-type buried layer corresponds to a maximum defect density of 5 defects per area of a 6 inch wafer.

17. The method of claim 1, wherein the first charge type buried layer is an n-type buried layer, the first charge type dopants are n-type dopants, and wherein said n-type buried layer has a sheet resistance of less than 40 ohms per square.

18. The method of claim 1, wherein the first charge type buried layer is an n-type buried layer, the first charge type dopants are n-type dopants, the method further comprising:
- after removing the pre-anneal oxide, forming semiconductor material in the integrated circuit over the n-type buried layer; and
- forming a bipolar junction device in the semiconductor material in the integrated circuit, such that the n-type buried layer is a buried collector of the bipolar junction transistor above a p-type substrate of the integrated circuit.

19. The method of claim 1, wherein the first charge type buried layer is an n-type buried layer, the first charge type dopants are n-type dopants, the method further comprising:
- after removing the pre-anneal oxide, forming epitaxial semiconductor material in the integrated circuit over the n-type buried layer.

20. The method of claim 1, wherein the first charge type buried layer is a p-type buried layer, the first charge type dopants are p-type dopants.

* * * * *